(12) United States Patent
Owa

(10) Patent No.: US 7,061,043 B2
(45) Date of Patent: Jun. 13, 2006

(54) NON-VOLATILE SEMICONDUCTOR MEMORY DEVICE AND METHOD OF MANUFACTURING THE SAME

(75) Inventor: Yoshihito Owa, Hakushu-machi (JP)

(73) Assignee: Seiko Epson Corporation, Tokyo (JP)

( * ) Notice: Subject to any disclaimer, the term of this patent is extended or adjusted under 35 U.S.C. 154(b) by 9 days.

(21) Appl. No.: 10/782,950

(22) Filed: Feb. 23, 2004

(65) Prior Publication Data

US 2004/0228185 A1  Nov. 18, 2004

(30) Foreign Application Priority Data

Feb. 28, 2003  (JP) .............................. 2003-054451

(51) Int. Cl.
*H01L 29/788* (2006.01)
*H01L 29/792* (2006.01)

(52) U.S. Cl. .................... 257/316; 257/317; 257/321; 257/324

(58) Field of Classification Search ............... 257/315, 257/316, 317, 321, 324

See application file for complete search history.

(56) References Cited

U.S. PATENT DOCUMENTS

| | | | |
|---|---|---|---|
| 5,408,115 A | 4/1995 | Chang | |
| 5,422,504 A | 6/1995 | Chang et al. | |
| 5,494,838 A | 2/1996 | Chang et al. | |
| 5,969,383 A | 10/1999 | Chang et al. | |
| 6,177,318 B1 | 1/2001 | Ogura et al. | |
| 6,248,633 B1 | 6/2001 | Ogura et al. | |
| 6,255,166 B1 | 7/2001 | Ogura et al. | |
| 6,504,207 B1 * | 1/2003 | Chen et al. | 257/319 |
| 6,534,821 B1 * | 3/2003 | Hsieh et al. | 257/315 |
| 6,587,380 B1 | 7/2003 | Kanai et al. | |
| 6,587,381 B1 | 7/2003 | Kanai et al. | |
| 6,646,916 B1 | 11/2003 | Kamei | |
| 6,650,591 B1 | 11/2003 | Owa | |
| 6,654,282 B1 | 11/2003 | Kanai | |
| 6,697,280 B1 | 2/2004 | Natori | |
| 6,704,224 B1 | 3/2004 | Natori | |
| 6,707,695 B1 | 3/2004 | Owa | |
| 6,707,716 B1 | 3/2004 | Natori | |
| 6,707,720 B1 | 3/2004 | Kamei et al. | |
| 6,707,742 B1 | 3/2004 | Kamei | |
| 6,710,399 B1 | 3/2004 | Kamei | |

(Continued)

FOREIGN PATENT DOCUMENTS

JP   A 05-198823   8/1993

(Continued)

OTHER PUBLICATIONS

U.S. Appl. No. 10/728,746, filed Dec. 8, 2003, Natori.

(Continued)

*Primary Examiner*—Ngân V. Ngô
(74) *Attorney, Agent, or Firm*—Oliff & Berridge, PLC

(57) ABSTRACT

A non-volatile semiconductor memory device with a small layout area, having a memory cell array including a plurality of memory cells arranged in a column direction and a row direction, wherein: each of the memory cells has a source region, a drain region, a channel region disposed between the source region and the drain region, a select gate and a word gate disposed to face the channel region, and a non-volatile memory element provided between the word gate and the channel region; and a longitudinal section of the word gate has a base, a side which is perpendicular to the base, and a curved side which connects the base to the side.

6 Claims, 19 Drawing Sheets

U.S. PATENT DOCUMENTS

| | | |
|---|---|---|
| 6,717,854 B1 | 4/2004 | Natori |
| 6,738,291 B1 | 5/2004 | Kamei |
| 6,744,106 B1 | 6/2004 | Kanai |
| 6,757,197 B1 | 6/2004 | Kamei |
| 6,760,253 B1 | 7/2004 | Kamei |
| 6,762,960 B1 | 7/2004 | Natori |
| 6,768,681 B1* | 7/2004 | Kim ................. 365/185.28 |
| 2002/0191453 A1 | 12/2002 | Owa |
| 2003/0025149 A1 | 2/2003 | Kanai |
| 2003/0025150 A1 | 2/2003 | Kanai et al. |
| 2003/0027411 A1 | 2/2003 | Kanai |
| 2003/0072191 A1 | 4/2003 | Kamei |
| 2003/0072194 A1 | 4/2003 | Kamei |
| 2003/0095443 A1 | 5/2003 | Natori |
| 2003/0146465 A1* | 8/2003 | Wu ......................... 257/314 |
| 2003/0151070 A1 | 8/2003 | Natori |
| 2003/0164517 A1 | 9/2003 | Kamei |
| 2003/0174558 A1 | 9/2003 | Kamei |
| 2003/0179609 A1 | 9/2003 | Natori |
| 2003/0198102 A1 | 10/2003 | Kamei |
| 2003/0198103 A1 | 10/2003 | Kamei |
| 2004/0013018 A1 | 1/2004 | Kanai |
| 2004/0013027 A1 | 1/2004 | Kanai |
| 2004/0061139 A1 | 4/2004 | Natori |

FOREIGN PATENT DOCUMENTS

| | | |
|---|---|---|
| JP | A 6-181319 | 6/1994 |
| JP | A 7-161851 | 6/1995 |
| JP | A 11-074389 | 3/1999 |
| JP | B1 2978477 | 9/1999 |
| JP | A 2001-156188 | 6/2001 |
| JP | A 2001-168219 | 6/2001 |
| JP | A 2002-170891 | 6/2002 |
| JP | A 2002-203918 | 7/2002 |
| JP | A 2003-017600 | 1/2003 |

OTHER PUBLICATIONS

U.S. Appl. No. 10/733,455, filed Dec. 12, 2003, Kanai.
U.S. Appl. No. 10/779,683, filed Feb. 18, 2004, Kanai.
U.S. Appl. No. 10/782,974, filed Feb. 23, 2004, Owa.
U.S. Appl. No. 10/783,019, filed Feb. 23, 2004, Maemura.
U.S. Appl. No. 10/782,975, filed Feb. 24, 2004, Maemura.
Hayashi, Yutaka et al. "Twin MONOS Cell with Dual Control Gates." 2000 Symposium on VLSI Technology Digest of Technical Papers, 2000 IEEE.
Chang, Kuo-Tung et al. "A New SONOS Memory Using Source-Side Injection for Programming," IEEE Electron Device Letters, vol. 19 No. 7 (pp. 253-254) Jul. 1998.
Chen, Wei-Ming et al. "A Novel Flash Memory Device with SPlit Gate Source Side Injection and ONO Charge Storage Stack (SPIN)." 1997 Symposium on VLSI Technology Digest of Technical Papers (pp. 63-64).

\* cited by examiner

NON-VOLATILE SEMICONDUCTOR MEMORY DEVICE AND METHOD OF MANUFACTURING THE SAME Japanese Patent Application No. 2003-54451, filed on Feb. 28, 2003, is hereby incorporated by reference in its entirety.

BACKGROUND OF THE INVENTION

The present invention relates to a non-volatile semiconductor memory device including a non-volatile memory element which is controlled by a word gate and a select gate.

As an example of a non-volatile semiconductor memory device, a MONOS (Metal-Oxide-Nitride-Oxide-Semiconductor or -Substrate) non-volatile semiconductor memory device is known. In the MONOS non-volatile semiconductor memory device, a gate insulating film between a channel and a gate is formed of a laminate consisting of a silicon oxide film, a silicon nitride film, and a silicon oxide film, and a charge is trapped in the silicon nitride film.

As such a MONOS non-volatile semiconductor memory device, a MONOS flash memory cell including a non-volatile memory element (MONOS memory element) controlled by one select gate and one control gate is disclosed (see Japanese Patent Application Laid-open No. 6-181319, Japanese Patent Application Laid-open No. 11-74389, U.S. Pat. No. 5,408,115, and U.S. Pat. No. 5,969,383, for example).

BRIEF SUMMARY OF THE INVENTION

The present invention may provide a non-volatile semiconductor memory device having a small layout area.

According to a first aspect of the present invention, there is provided a non-volatile semiconductor memory device comprising:

a memory cell array including a plurality of memory cells arranged in a column direction and a row direction, wherein:

each of the memory cells has a source region, a drain region, a channel region disposed between the source region and the drain region, a word gate disposed to face the channel region, and a non-volatile memory element provided between the word gate and the channel region; and a longitudinal section of the word gate has a base, a side which is perpendicular to the base, and a curved side which connects the base to the side.

Each of the memory cells may have a word gate support section which faces the side of the word gate; and a longitudinal section of the word gate support section may have a base, a side which is perpendicular to the base, and a curved side which connects the base to the side.

A bitline may be connected in common to the drain regions of the memory cells in each column; and the word gate support section may be formed of an insulator.

Alternatively, a bitline may be connected in common to the source regions of the memory cells in each column; and the word gate support section may be formed of an insulator.

Alternatively, a bitline may be connected in common to the drain regions of the memory cells in each column; the word gate support section may be formed of a conductor; and the word gate support section may be insulated from the word gate and the drain region.

A bitline may be connected in common to the source regions of the memory cells in each column; and the non-volatile semiconductor memory device may further comprise a conductor which is electrically connected to the drain region and is insulated from the word gate in each of the memory cells.

The non-volatile memory element may be formed to extend between the word gate and the word gate support section.

Alternatively, the non-volatile memory element may be formed to extend between the word gate and the conductor.

The non-volatile semiconductor element may be formed of an ONO film which includes two oxide films (O) and a nitride film (N) between the two oxide films (O).

According to a second aspect of the present invention, there is provided a method of manufacturing a non-volatile semiconductor memory device, comprising:

forming a base material layer on a semiconductor layer and patterning the base material layer;

forming a trap layer on the entire surface of the semiconductor layer on which the base material layer is formed;

forming a first conductive layer on the trap layer, and shaping the first conductive layer into a plurality of sidewalls respectively provided on the sides of the patterned base material layer with the trap layer interposed;

forming a first insulating film which covers the sidewalls of the first conductive layer and the base material layer;

forming a second conductive layer which is in contact with the semiconductor layer between adjacent two of the sidewalls of the first conductive layer; and shaping the base material layer into a plurality of sidewalls.

The base material layer may be an insulating layer.

Alternatively, the base material layer may be a conductive layer.

According to a third aspect of the present invention, there is provided a method of manufacturing a non-volatile semiconductor memory device, comprising:

forming a two-layer structure including a trap layer disposed on a semiconductor layer and a first conductive layer formed on the trap layer;

forming a plurality of word gate support sections each having a shape of sidewall respectively on the sides of the two-layer structure;

forming a second conductive layer which is in contact with the semiconductor layer between adjacent two of the word gate support sections;

shaping the first conductive layer into a plurality of word gate layers each having a shape of sidewall; and etching part of the trap layer between adjacent two of the word gate layers.

According to a fourth aspect of the present invention, there is provided a method of manufacturing a non-volatile semiconductor memory device, comprising:

forming a first conductive layer which is in contact with a diffusion region in a semiconductor layer;

forming a trap layer on the entire surface of the semiconductor layer on which the first conductive layer is formed;

forming a second conductive layer on the trap layer;

shaping the second conductive layer into a plurality of sidewalls respectively provided on the sides of the first conductive layer; and etching part of the trap layer between adjacent two of sidewalls of the second conductive layer.

DETAILED DESCRIPTION OF THE EMBODIMENT

1. First Embodiment

A first embodiment of the present invention is described below with reference to the drawings.

1.1 Entire Configuration and Memory Block

Figure 1:
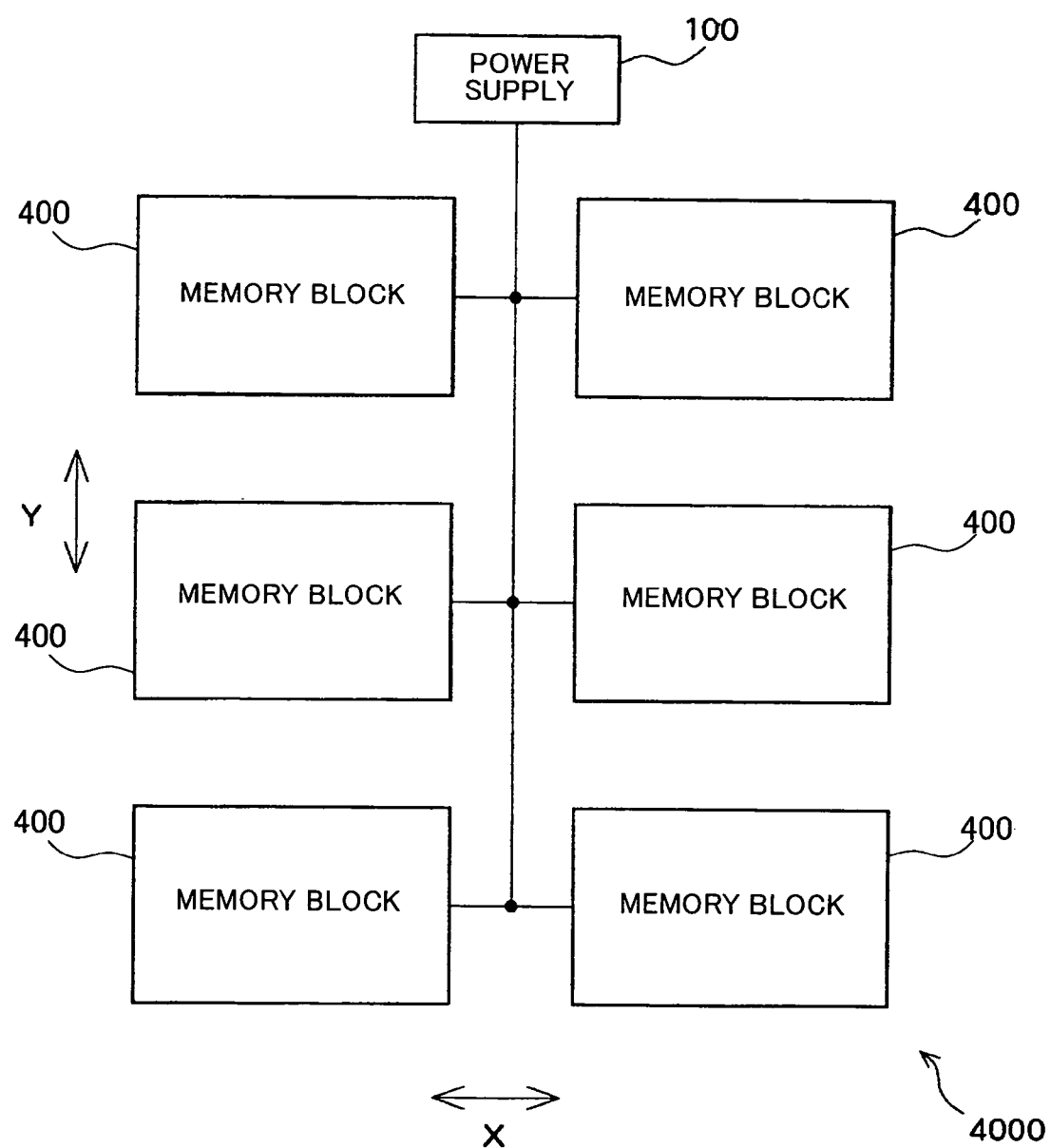
FIG. 1 is a block diagram showing the entire configuration of a non-volatile semiconductor memory device according to one embodiment of the present invention.

FIG. 1 is a block diagram showing the entire configuration of a non-volatile semiconductor memory device according to one embodiment of the present invention. A memory cell array 4000 includes a plurality of memory cells 410 (illustrated later) arranged along a row direction X and a column direction Y. The memory cell array 4000 includes a plurality of memory blocks 400. A plurality of types of voltages are generated by a power supply circuit 100. The voltages generated by the power supply circuit 100 are supplied to the memory blocks 400 through a plurality of voltage supply lines. The memory cell array 4000 includes a bitline driver section (not shown) which drives bitlines 60 (illustrated later) in the memory cell array 4000.

Figure 2:
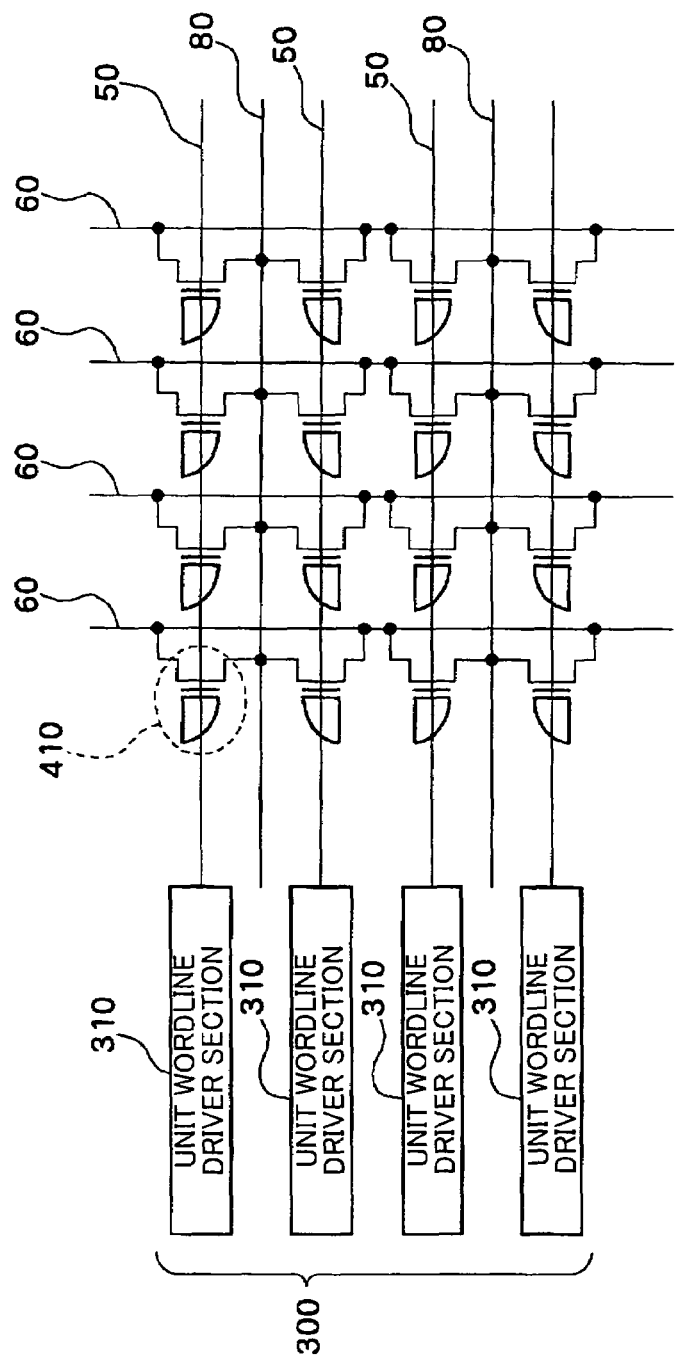
FIG. 2 is a diagram showing a memory block according to one embodiment of the present invention.

FIG. 2 is a circuit diagram showing a part of the memory block 400. The memory block 400 includes a plurality of wordlines 50, a plurality of bitlines 60, a plurality of source lines 80, and a plurality of memory cells 410. The memory block 400 includes a word line driver section 300 and a source line driver section (not shown). In FIG. 2, the area encircled by a dotted line indicates the memory cell 410.

The memory cell 410 includes a word gate support section 411, a word gate 412, and an ONO film 413 (illustrated later). The structure of the memory cell 410 is described later in detail.

The wordline driver section 300 includes a plurality of unit wordline driver sections 310. The wordline 50 connects in common the word gates 412 (illustrated later) of the memory cells 410 disposed in the memory block 400 along the row direction X.

The bitline 60 connects in common bitline diffusion layers BLD (illustrated later) of the memory cells 410 in the column direction Y. The source line 80 connects in common source line diffusion layers SLD (illustrated later) of the memory cells 410 in the row direction X.

Figure 3:
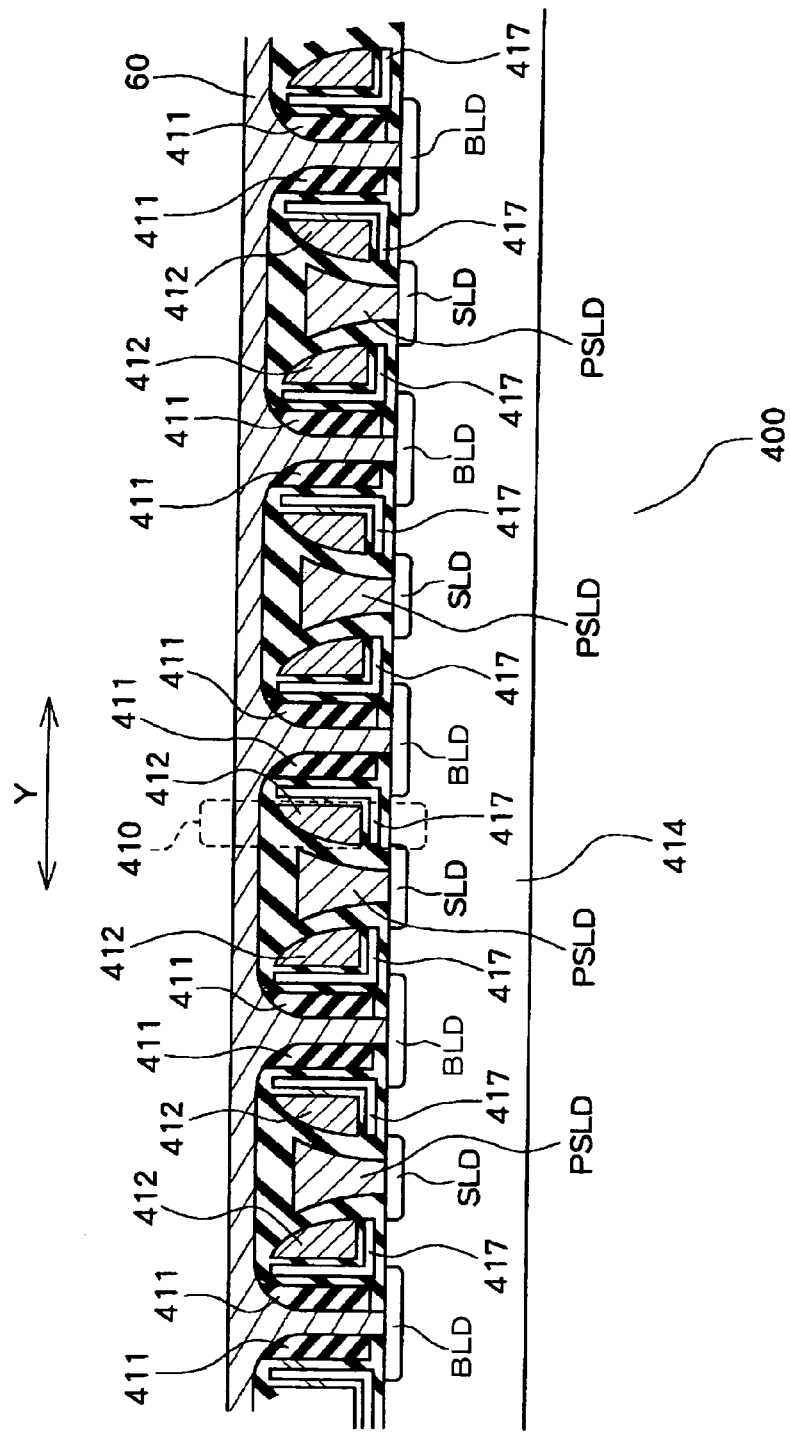
FIG. 3 is a cross-sectional view showing a memory block according to a first embodiment of the present invention.

FIG. 3 is a cross-sectional view of a part of the memory block 400. A numeral 414 indicates a substrate. The bitline 60 may be formed of a conductor (metal, for example). The word gate support section 411 and the word gate 412 are disposed on an upper layer of a channel region between source/drain regions (diffusion layers indicated by the symbol BLD or SLD in FIG. 3) through an insulator film ($SiO_2$, for example). The insulator film may be formed of a nitride oxide film. The word gate support section 411 is disposed on an upper layer of the bitline diffusion layer BLD. The nitride film 417 (SiN, for example) is formed between the word gate 412 and the channel region in the shape of the letter "L" (or inverted L shape). The word gate support section 411 is formed of an insulator ($SiO_2$, for example). The word gate 412 may be formed of polysilicon. A symbol PSLD indicates a poly plug (plug made of polysilicon). The poly plug PSLD may be formed of a conductor other than polysilicon. The poly plug PSLD has an effect of reducing the resistance of the source line diffusion layer SLD.

The bitline diffusion layer BLD is shared by two memory cells 410 disposed on either side of the bitline diffusion layer in the column direction Y. The source line diffusion layer SLD is shared by two memory cells 410 disposed on either side of the source line diffusion layer in the column direction Y. In the cross section shown in FIG. 3, the bitline diffusion layers BLD are connected in common with the bitline 60 along the column direction Y. In the drawings, sections indicated by the same symbols as in FIG. 3 have the same meanings as in FIG. 3.

Figure 4:
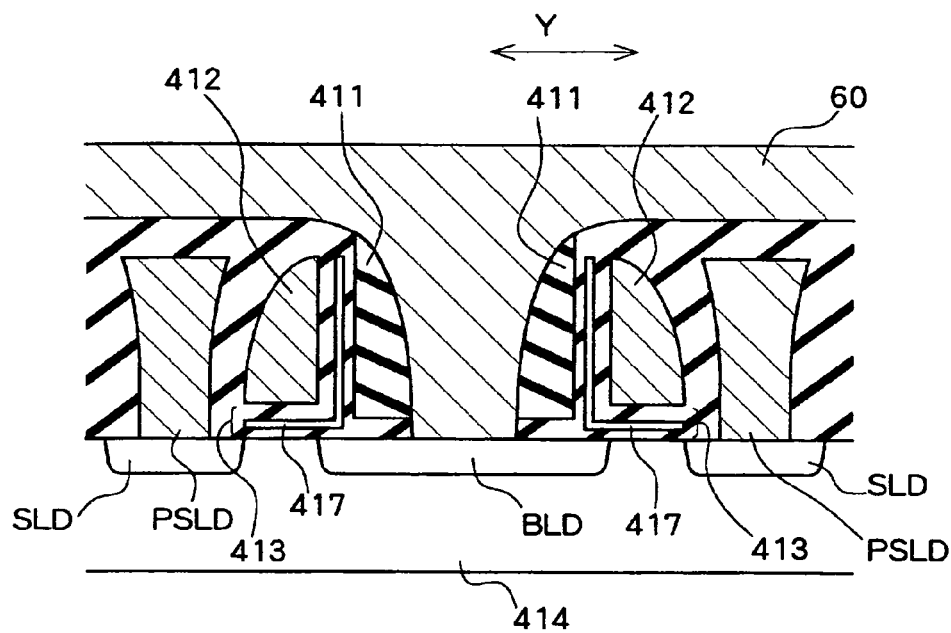
FIG. 4 is another cross-sectional view showing a memory block according to the first embodiment.
Figure 5:
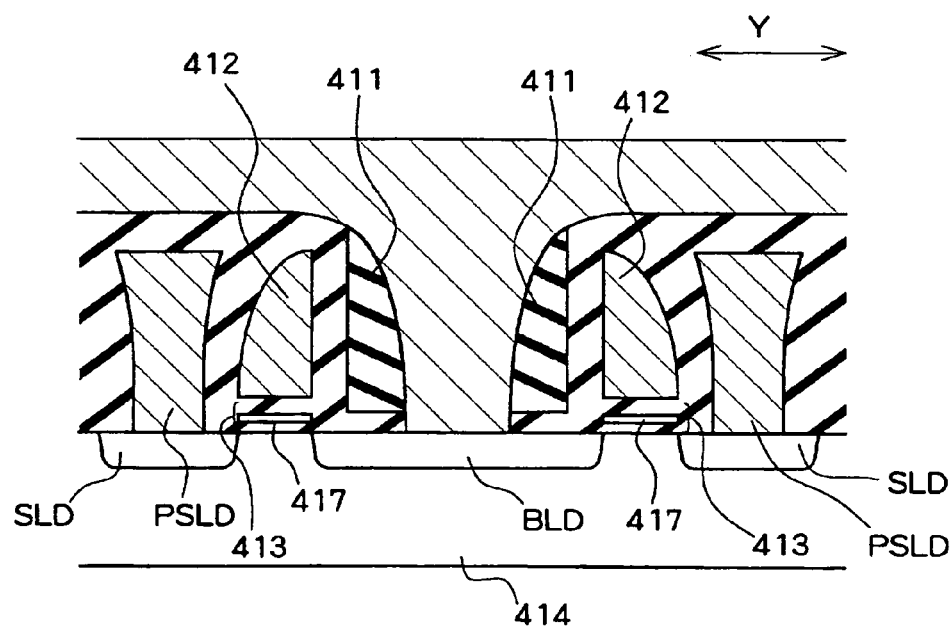
FIG. 5 is a cross-sectional view showing a memory block according to a modification of the first embodiment.

FIG. 4 is a view showing a part of FIG. 3. The ONO film 413 has a structure in which the nitride film 417 is sandwiched between films of an insulator 416 ($SiO_2$, for example). As a modification according to this embodiment, the nitride film 417 of the memory cell 410 need not be formed to extend between the word gate support section 411 and the word gate 412, as shown in FIG. 5.

A silicide (not shown) may be formed on the surface of the word gate 412. A Co silicide or Ti silicide may be used as the silicide (not shown), for example. This enables the resistance of the word gate 412 to be reduced.

The bitline diffusion layer BLD and the source line diffusion layer SLD may each be replaced by the other, differing from the above-described structure. In this case, the output voltage of the bitline driver section (not shown) and the output voltage of the source line driver section (not shown) may each be replaced by the other. This configuration is described later.

Figure 6:
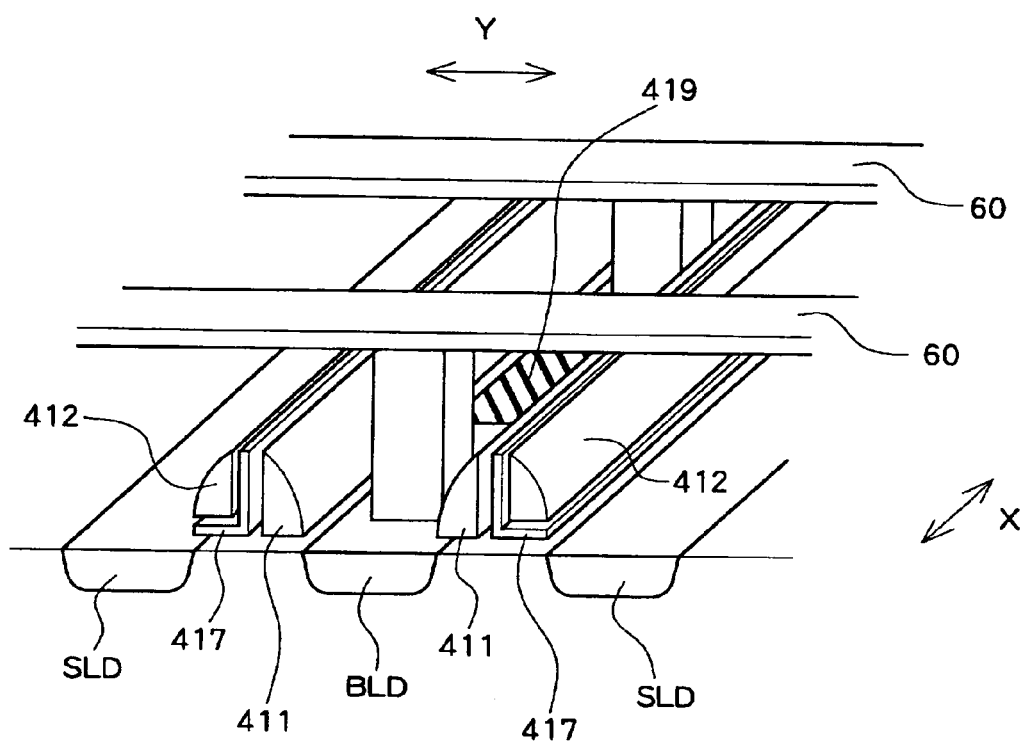
FIG. 6 is a schematic perspective view showing a part of the memory block in FIG. 3.

FIG. 6 is a schematic oblique view three-dimensionally showing a part of FIG. 3. In FIG. 6, the bitline diffusion layers BLD are isolated in the row direction X by an element isolation section 419 (shallow-trench-isolation (STI), for example). This enables the bitlines 60 to be electrically isolated in units of memory cells 410 arranged along the row direction X. Since the word gate 412 is continuously formed along the row direction X, the word gate 412 may be used as the wordline 50. A metal interconnect may be backed along the word gate 412, and the metal interconnect may be used as the wordline 50.

1.2. Operations

In this embodiment, the memory cell 410 is accessed in units of the memory blocks 400. Specifically, the memory cell 410 is selected by selecting one memory block 400, and selecting one memory cell 410. The memory cell 410 selected is called a selected memory cell. The memory block 400 including the selected memory cell is called a selected memory block, and the memory blocks 400 other than the selected memory block are called unselected memory blocks.

The wordline 50 selected from among the plurality of wordlines 50 is called a selected wordline, and the wordlines 50 other than the selected wordline are called unselected wordlines. The bitline 60 selected from among the plurality of bitlines 60 is called a selected bitline, and the bitlines 60 other than the selected bitline are called unselected bitlines. The source line 80 selected from among the plurality of source lines 80 is called a selected source line, and the source lines 80 other than the selected source line are called unselected source lines.

The wordlines 50, the bitlines 60, and the source lines 80 in the unselected memory block are set at an unselected memory block voltage (0 V) in all operations. Each operation (standby, read, program, and erase) is described below with reference to FIG. 2.

1.2.1 Standby

All the wordlines 50 are set at a standby word voltage (0 V). All the bitlines 60 are set at a standby bit voltage (0 V). All the source lines 80 are set at a standby source voltage (0 V).

All the memory cells 410 in the memory cell array 4000 (in the selected memory block and the unselected memory blocks) are set at the above-described voltage application state during standby.

1.2.2 Read

The memory cell 410 encircled by a dotted line in FIG. 2 indicates a selected memory cell. The wordline 50 connected with the selected memory cell (selected wordline) is charged to a read selected word voltage (power supply voltage Vcc). All the source lines 80 in the selected memory block are set at a read selected source voltage (0 V). The bitline 50 connected with the selected memory cell (selected bitline) is set at a read selected bit voltage (Vsa, 1 V, for example), and other bitlines 60, that is, all the unselected bitlines in the selected memory block are set at a read unselected bit voltage (0 V). All the unselected wordlines in the selected memory block are set at a read unselected word voltage (0 V). A read substrate voltage (0 V) is applied to the substrate 414 in the selected memory block.

The above-described voltage application state causes a channel to be formed in the channel region between the source line diffusion layer SLD and the bitline diffusion layer BLD on either side of the selected memory cell. Since the word gate 412 of the selected memory cell is charged to the read selected word voltage (Vcc), a channel current flows through the channel region. This allows a current (IDS) to flow through the channel region between the source line diffusion layer SLD and the bitline diffusion layer BLD on either side of the selected memory cell.

Figure 7:
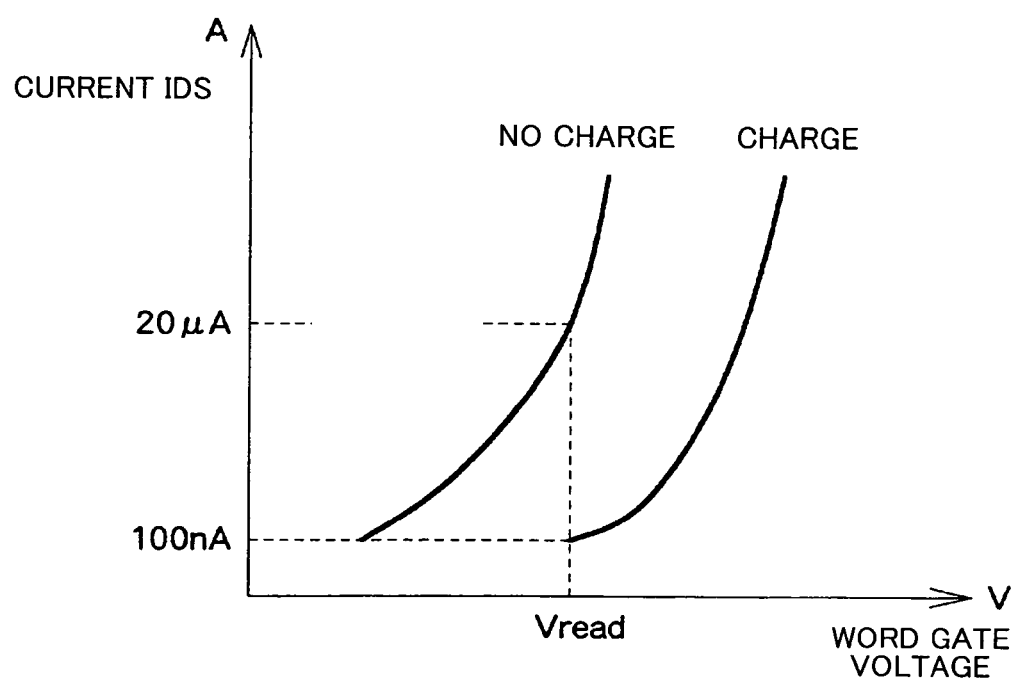
FIG. 7 is a graph showing the relationship between the charge and a current in an ONO film.

The three-region structure consisting of the word gate 412, the ONO film 413, and the channel region of the memory cell 410 may be considered as a MOS transistor. In this case, the threshold value of the transistor becomes higher in a state in which a charge is trapped in the ONO film 413 than in a state in which a charge is not trapped in the ONO film 413. FIG. 7 shows the correlation between the presence or absence of a charge and a current which flows between the source line diffusion layer SLD and the bitline diffusion layer BLD.

In FIG. 7, in the case where a voltage Vread is applied to the word gate 412, about 20 μA of current IDS flows when a charge is not trapped in the ONO film, and the current IDS flows only to a small extent when a charge is trapped in the ONO film. Specifically, since the threshold value of the transistor increases when a charge is trapped in the ONO film, the current IDS flows only to a small extent if the voltage applied to the word gate 412 is the voltage Vread.

The data retained in the selected memory cell can be read by reading the amount of current using a sense amplifier (not shown) disposed for each bitline 60.

This is the principle of reading data from the selected memory cell. The above-described read operation is a forward read. Specifically, a higher voltage is applied to the bit line diffusion layer BLD than to the bitline diffusion layer BLD in the same manner as in the program operation. A reverse read may also be used as the read method. In this case, the voltages applied to the source line diffusion layer SLD and the bitline diffusion layer BLD in this embodiment are each replaced by the other.

The voltage application state during reverse reading is described below. The selected wordline is charged to a reverse read selected word voltage (power supply voltage Vcc). The source lines 80 in the selected memory cell are set at a reverse read selected source voltage (Vcc). The selected bitline is set at a reverse read selected bit voltage (Vcc-Vsa), and all the unselected bitlines in the selected memory block are set at a reverse read unselected bit voltage (0V). All the unselected wordlines are set at a reverse read unselected word voltage (0 V). A read substrate voltage (0 V) is applied to the substrate 414 in the selected memory block. The principle of reading data from the memory cell 410 is the same as that of the forward read. A channel current flows through the channel formed between the bitline diffusion layer BLD and the source line diffusion layer SLD of the selected memory cell by application of the voltage to the word gate 412 of the selected memory cell. The selected bitline is charged to the reverse read selected bit voltage (Vcc-Vsa). The bitlines 60 other than the selected bitline are set at 0 V. The voltage Vsa may be 1 V, for example. Therefore, a current flows from the source line to the selected bitline line which is set at (Vcc-Vsa). In the case of the selected memory cell in which a charge is not trapped in the ONO film 413, a greater amount of current flows through the channel region of the selected memory cell.

Table 1 shows the voltage application state during reading. The unselected memory cell A in Table 1 indicates one among the unselected memory cells in the selected memory block in which neither the bitline nor the word line are connected in common to the selected memory cell. The unselected memory cell B in Table 1 indicates one among unselected memory cells in the selected memory block in which not the word line but the bitline is connected in common to the selected memory cell. The unselected memory cell C in Table 1 indicates one among unselected memory cells in the selected memory block in which not the bitline but the word line is connected in common to the selected memory cell. A numerical value or Vcc in the cell in Table 1 indicates a voltage value. A symbol WL indicates the wordline 50, and a symbol SL indicates the source line 80. A symbol BL indicates the bitline 60. In all tables, symbols the same as the symbols as in Table 1 have the same meanings as in Table 1.

TABLE 1

| | | Selected block | | | | |
|---|---|---|---|---|---|---|
| | | Unselected memory cell A | Unselected memory cell B | Unselected memory cell C | Selected memory cell | Unselected block |
| Forward read | WL | 0 V | 0 V | Vcc | Vcc | 0 V |
| | SL | 0 V | 0 V | 0 V | 0 V | 0 V |
| | BL | 0 V | Vsa | 0 V | Vsa | 0 V |
| Reverse read | WL | 0 V | 0 V | Vcc | Vcc | 0 V |
| | SL | 0 V | Vcc | 0 V | Vcc | 0 V |
| | BL | 0 V | Vcc–Vsa | 0 V | Vcc–Vsa | 0 V |

The unselected block in Table 1 is in the same state as the standby state. The unselected block is also in the same state as the standby state during programming and erasing.

As shown in Table 2, the applied voltages for the symbol SL (source line 80) and the symbol BL (bitline 60) may each be replaced by the other in the forward read and the reverse read. Since the gate element which controls the current which flows through the channel in the selected memory cell is only the word gate 412, the current can be caused to flow through the channel of the memory cell 410 in either direction.

The cell for the symbol WL in the unselected memory cell has a value of 5.5 V or Vcc. This is because the unselected memory cells include an unselected memory cell connected with the selected wordline and an unselected memory cell which is not connected with the selected wordline. This also applies to the symbol SL. This is because the unselected memory cells include an unselected memory cell connected with the selected source line and an unselected memory cell which is not connected with the selected source line. The unselected block is in the same state as the standby state as described above.

TABLE 2

|  |  | Selected block | | | | Unselected block |
|---|---|---|---|---|---|---|
|  |  | Unselected memory cell A | Unselected memory cell B | Unselected memory cell C | Selected memory cell | |
| Forward read | WL | 0 V | 0 V | Vcc | Vcc | 0 V |
|  | SL | 0 V | Vsa | 0 V | Vsa | 0 V |
|  | BL | 0 V | 0 V | 0 V | 0 V | 0 V |
| Reverse read | WL | 0 V | 0 V | Vcc | Vcc | 0 V |
|  | SL | 0 V | Vcc−Vsa | 0 V | Vcc−Vsa | 0 V |
|  | BL | 0 V | Vcc | 0 V | Vcc | 0 V |

1.2.3 Program

The wordline 50 connected with the selected memory cell (selected wordline) is charged to a program selected word voltage (5.5 V). All the unselected wordlines in the selected memory block are set at a program unselected word voltage (0 V). The source line 80 connected with the selected memory cell (selected source line) is charged to a program selected source voltage (5 V), and all the unselected source lines are set at a program unselected source voltage (0 V). The bitline 60 connected with the selected memory cell (selected bitline) is charged to a program selected bit voltage (0 V), and the bitlines 60 other than the selected bitline, that is, all the unselected bitlines in the selected memory block are set at a program unselected bit voltage (Vcc). A program substrate voltage (0 V) is applied to the substrate 414 in the selected memory block.

The above-described voltage application state causes a channel to be formed in the channel region between the source line diffusion layer SLD and the bitline diffusion layer BLD on either side of the selected memory cell. Since the word gate 412 of the selected memory cell is charged to the program selected word voltage (5.5 V), electrons injected into the channel region become hot electrons. The hot electrons are drawn toward the word gate. The hot electrons drawn toward the word gate are trapped in the ONO film 413. This is the principle of writing (programming) data into the selected memory cell.

Table 3 shows the voltage application state during programming.

TABLE 3

|  |  | Selected block | | Unselected block |
|---|---|---|---|---|
|  |  | Unselected memory cell | Selected memory cell | |
| Program | WL | 5.5 V or 0 V | 5.5 V | 0 V |
|  | SL | 0 V or 5 V | 5 V | 0 V |
|  | BL | Vcc | 0 V | 0 V |

The applied voltages for the symbol SL (source line 80) and the symbol BL (bitline 60) may each be replaced by the other in the same manner as in the read operation (see Table 4).

TABLE 4

|  |  | Selected block | | Unselected block |
|---|---|---|---|---|
|  |  | Unselected memory cell | Selected memory cell | |
| Program | WL | 5.5 V or 0 V | 5.5 V | 0 V |
|  | SL | Vcc | 0 V | 0 V |
|  | BL | 0 V or 5 V | 5 V | 0 V |

The cell for the symbol BL in the unselected memory cell has a value of 0 V or 5 V. This is because the unselected memory cells include an unselected memory cell connected with the selected bitline and an unselected memory cell which is not connected with the selected bitline.

1.2.4 Erase

The erase operation is performed for all the memory cells 410 in the selected memory block. Specifically, all the memory cells 410 in the selected memory block are selected memory cells. All the wordlines 50 in the selected memory block are charged to an erase word voltage (−3 V). All the source lines 80 in the selected memory block are charged to an erase source voltage (5 V). All the bitlines 60 in the selected memory block are set at an erase bit voltage (0 V). An erase substrate voltage (0 V) is applied to the substrate 414 in the selected memory block.

The above-described voltage application state generates an electric field between the word gate 412 and the source line diffusion layer SLD, since the word gate 412 of the memory cell 410 in the selected block is charged to the erase word voltage (−3 V). The charge (electrons) which has been trapped in the ONO film 413 can be erased by hot holes generated by the application of the electric field.

Table 5 shows the voltage application state during erasing (erase by hot holes).

TABLE 5

| | | Selected block Selected memory cell | Unselected block |
|---|---|---|---|
| Erase | WL | −3 V | 0 V |
| | SL | 5 V | 0 V |
| | BL | 0 V | 0 V |

The applied voltages for the symbol SL (source line 80) and the symbol BL (bitline 60) may each be replaced by the other in the same manner as in the read operation (see Table 6).

TABLE 6

| | | Selected block Selected memory cell | Unselected block |
|---|---|---|---|
| Erase | WL | −3 V | 0 V |
| | SL | 0 V | 0 V |
| | BL | 5 V | 0 V |

In this embodiment, data is erased by the hot holes. However, data may be erased by using a Fowler-Nordheim (FN) erase method. All the wordlines 50 in the selected memory block are charged to an FN erase word voltage (−8 V). All the source lines 80 in the selected memory block are set at a floating state or at an FN erase source voltage (5 V). All the bitlines 60 in the selected memory block are set at an erase bit voltage (5 V). An FN erase substrate voltage (5 V) is applied to the substrate 414 (symbol Pwell) in the selected memory block. The FN erase method uses FN tunneling. The principle of this method is that the charge (electrons) in the ONO film 413 is released to the outside the ONO film 413 by a tunnel effect by applying a given electric field (voltage difference of 13 V, for example) to the ONO film 413.

The unselected memory block during the erase operation (erase by hot holes and FN erase) is in the same voltage application state as the standby state.

Table 7 shows the voltage application state during erasing (FN erase).

TABLE 7

| | | Selected block Selected memory cell | Unselected block |
|---|---|---|---|
| Erase | WL | −8 V | 0 V |
| | SL | 5 V | 0 V |
| | BL | 5 V | 0 V |
| | Pwell | 5 V | 0 V |

1.3. Comparison Example and Effect

Figure 8:
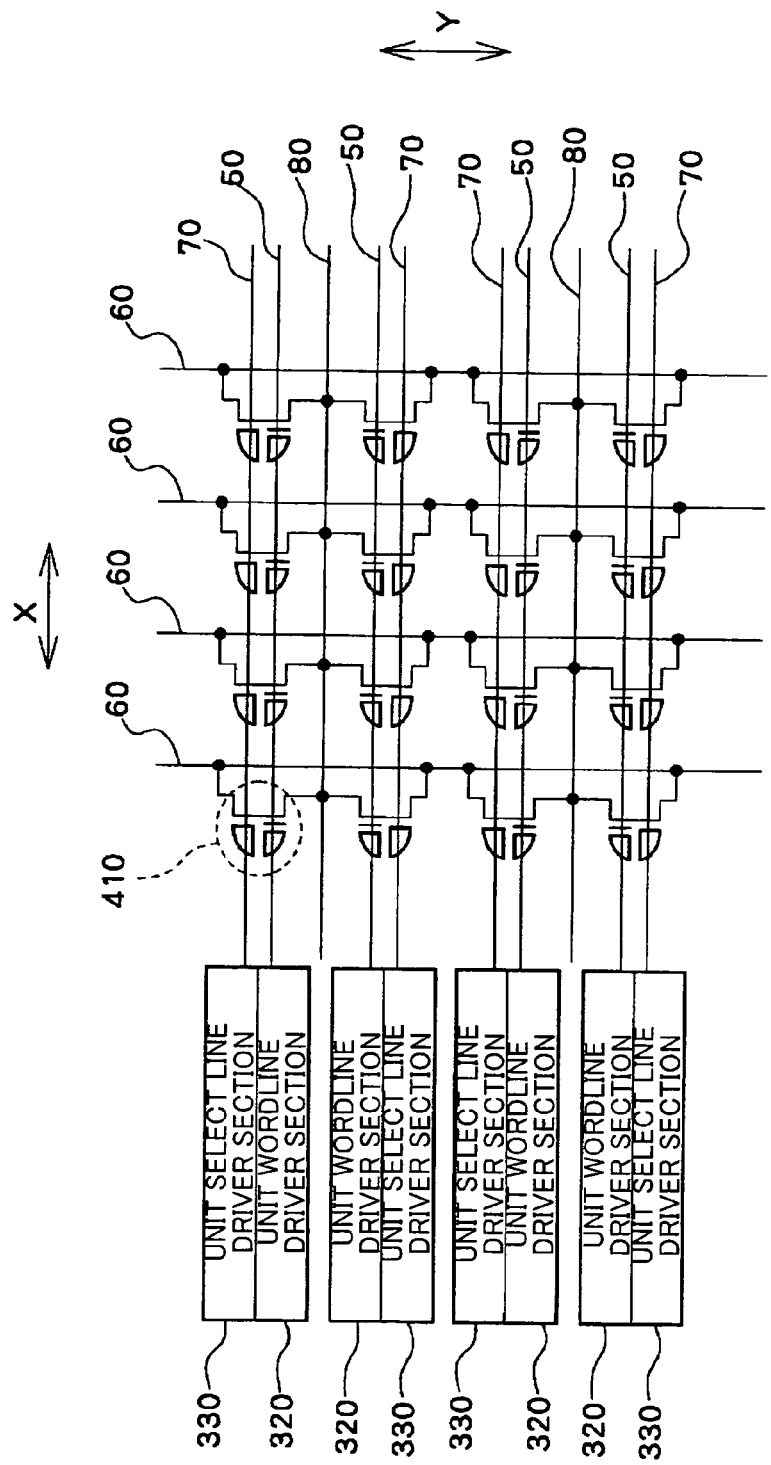
FIG. 8 is a diagram showing a part of a memory block according to a first comparative example relating to the first to fourth embodiments.

FIG. 8 is a view showing a part of the memory block 400 in a first comparative example. In FIG. 8, one wordline 50 and one select line 70 are connected with each of the memory cells 410 in the memory block 400 in the first comparative example. The wordline 50 and the select line 70 are respectively driven by a unit wordline driver section 320 and a unit select line driver section 330. Specifically, in the first comparative example, the unit wordline driver sections 320 and the unit select line driver sections 330 are necessary for the number of wordlines 50 and the number of select lines 70 in the memory block 400. Moreover, since the interconnect pitch is limited, it is necessary to contrive the arrangement method in order to dispose a large number of driver sections. This results in an increase in the layout area.

On the other hand, since the memory block 400 in this embodiment does not include the select line 70 used in the first comparative example, it is unnecessary to separately provide a unit driver section for the select line 70. Since the driver section exclusive for the select line 70 can be omitted, the layout area can be significantly reduced.

Figure 9:
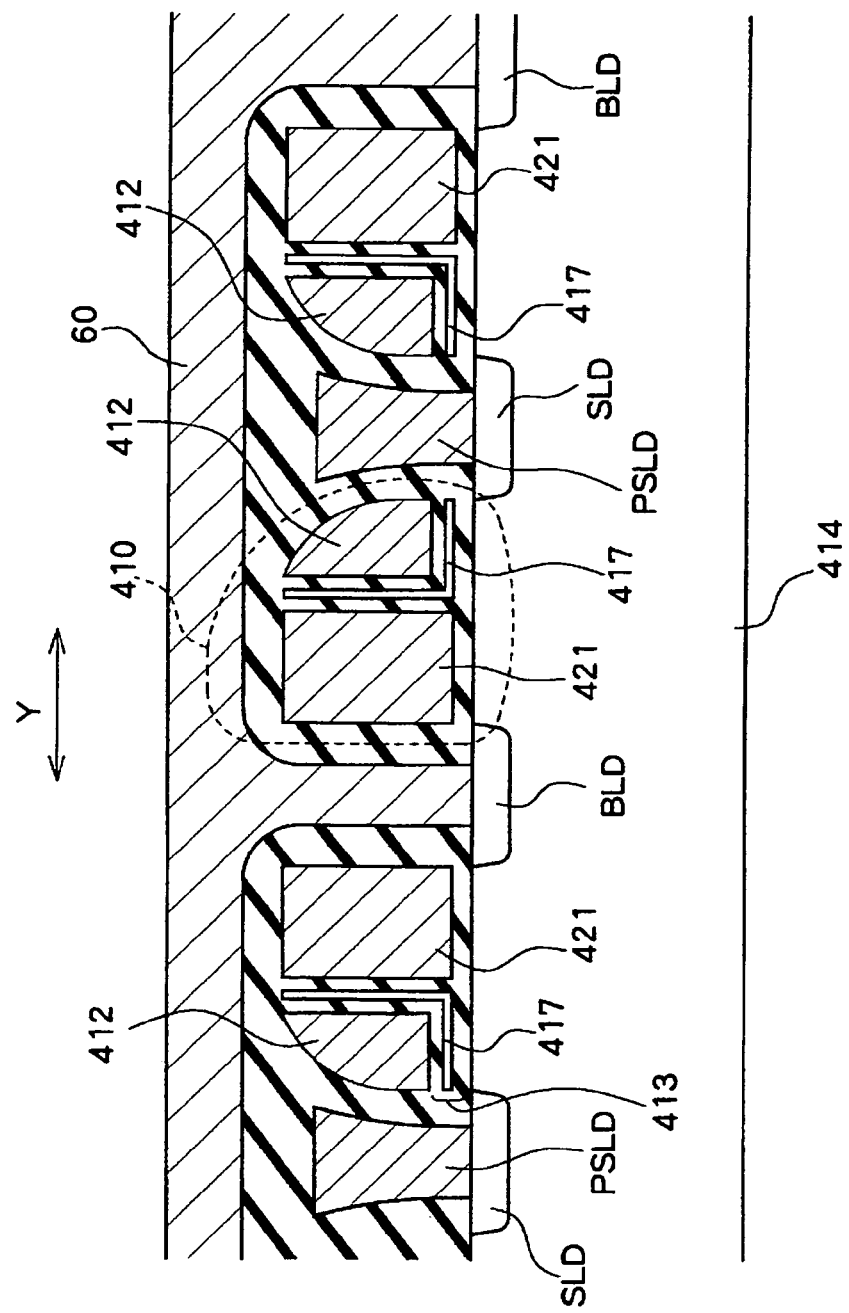
FIG. 9 is a cross-sectional view showing a part of a memory block according to a second comparative example relating to the first to fourth embodiments.

FIG. 9 is a cross-sectional view showing a part of the memory block 400 in a second comparative example. A numeral 421 in FIG. 9 indicates a select gate. The memory cell 410 in the second comparative example includes the select gate 421, the word gate 412, and the ONO film 413.

In this embodiment, the word gate 412 in the memory cell 410 is formed in the shape of a sidewall, and one word gate 412 is formed on one channel region. Therefore, the area of one memory cell 410 is reduced in this embodiment in comparison with the second comparative example. This enables the layout area of the memory cell array 4000 to be designed to be small.

In this embodiment, since the current which flows through the channel region in the memory cell 410 is controlled by one gate element (word gate 412), the layout of the memory cell array 4000 can be designed without taking into consideration the direction of current which flows between two diffusion layers (bitline diffusion layer BLD and source line diffusion layer SLD) in the memory cell 410. Therefore, this embodiment has an advantage of increasing the degrees of freedom in the design stage.

2. Second Embodiment

A second embodiment is described below with reference to the drawings.

Figure 10:
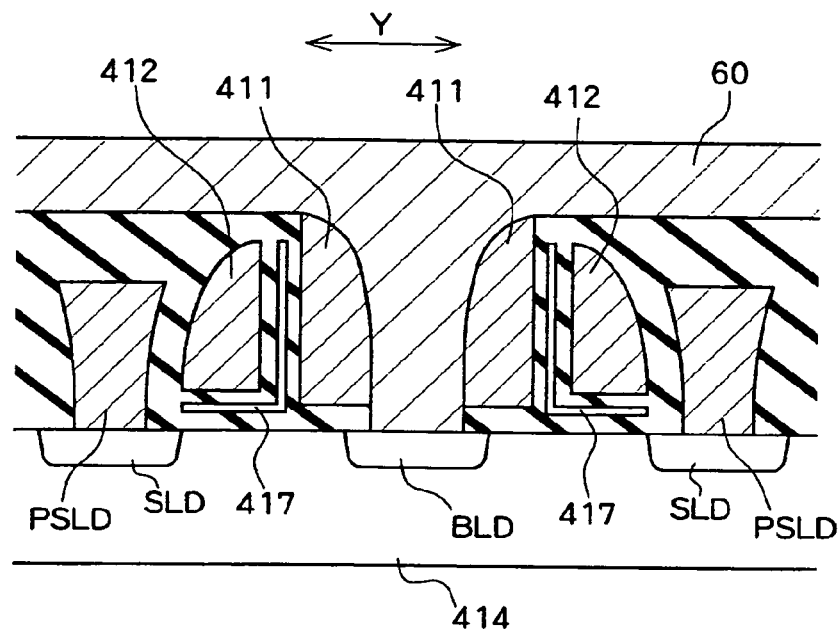
FIG. 10 is a cross-sectional view showing a memory block according to a second embodiment of the present invention.

FIG. 10 is a cross-sectional view showing a part of the memory block 400 in this embodiment. This embodiment differs from the first embodiment as to the material for the word gate support section 411. In the first embodiment, the word gate support section 411 is formed of an insulator (silicon oxide, for example). In this embodiment, the word gate support section 411 is formed of a conductor (polysilicon, for example). The rest of the details is the same as in the first embodiment.

Since the word gate support section 411 is formed of a conductor (polysilicon, for example) and is in contact with the bitline 60, a voltage is supplied to the word gate support section 411 from the bitline 60. Therefore, the width of the bitline diffusion layer BLD can be reduced in the column direction Y, as shown in FIG. 10.

Figure 11:
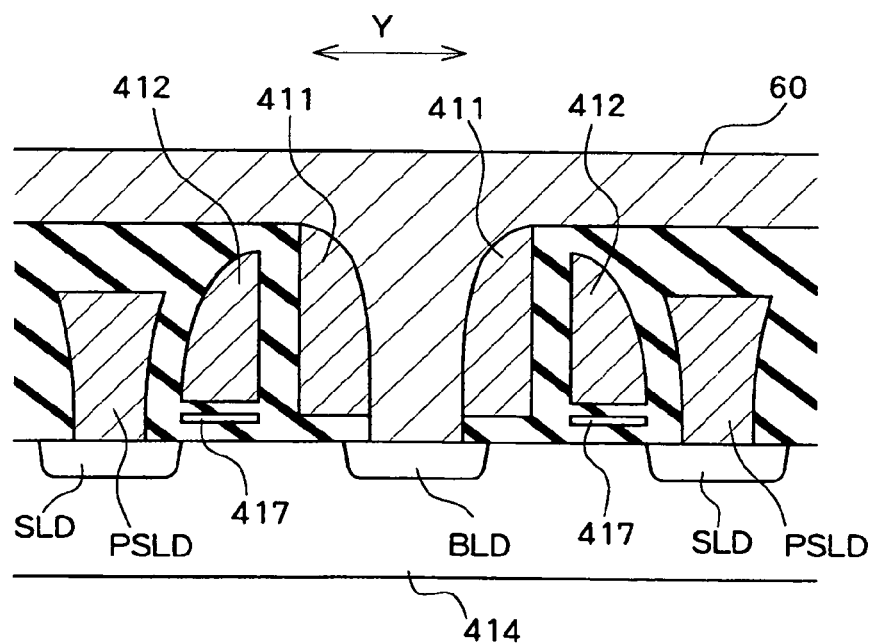
FIG. 11 is a cross-sectional view showing a memory block according to a modification of the second embodiment.
Figure 12:
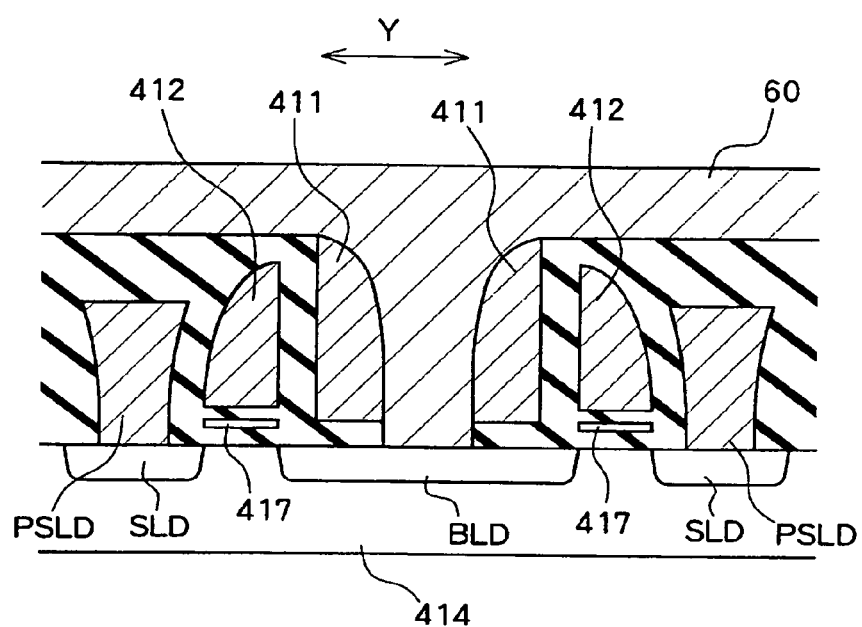
FIG. 12 is a cross-sectional view showing a memory block according to another modification of the second embodiment.

As a modification according to this embodiment, the nitride film 417 may be formed between the word gate 412 and the substrate 414 without being formed to extend between the word gate support section 411 and the word gate 412, as shown in FIG. 11. As shown in FIG. 12, the bitline diffusion layer BLD may be disposed to have an increased width in the column direction Y so as to reach the word gates 412 on either side.

Figure 13:
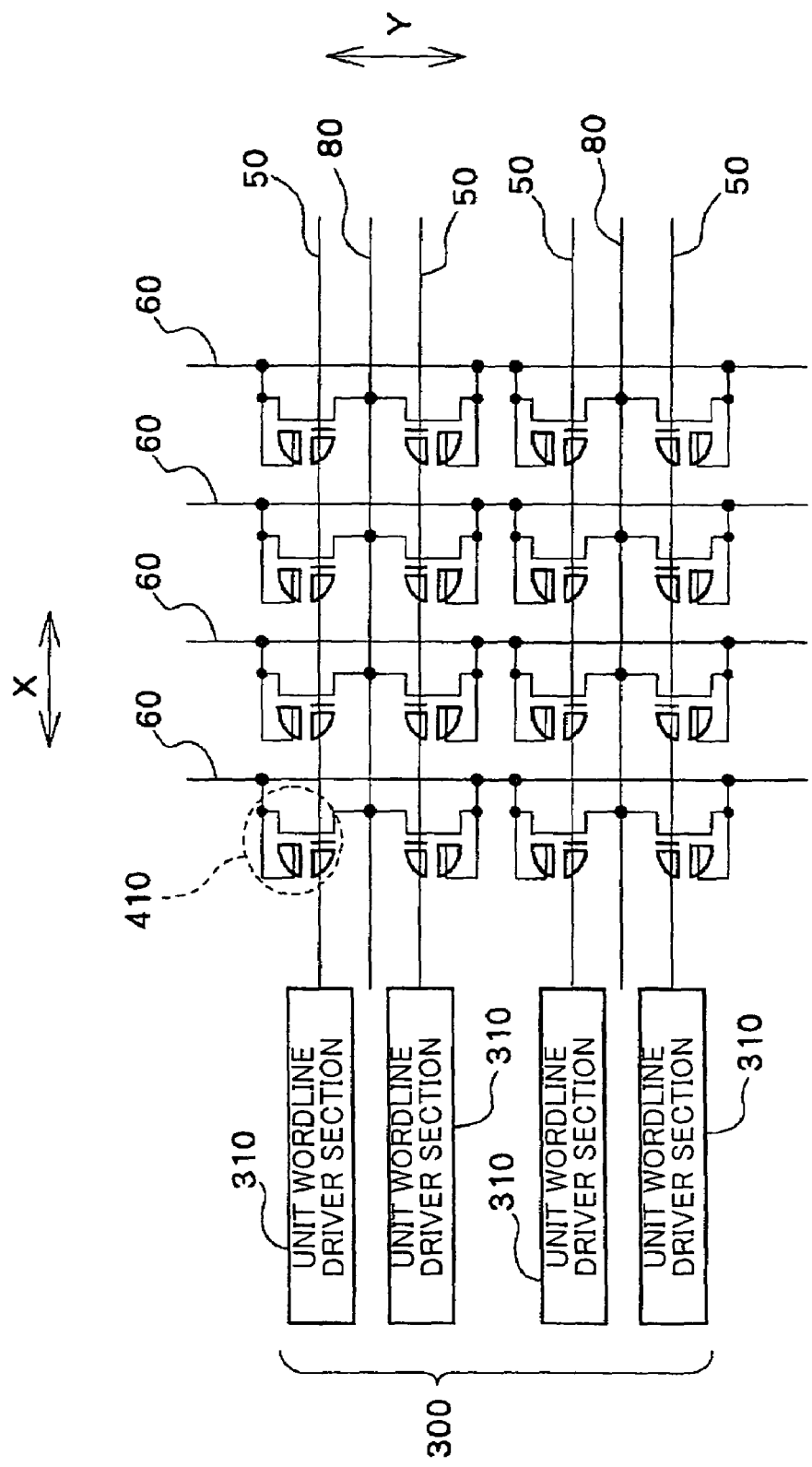
FIG. 13 is a diagram showing a part of a memory block according to the second embodiment of the present invention.

FIG. 13 is a circuit diagram showing a part of the memory block 400 having the feature shown in FIG. 10. Table 8 shows applied voltages in each operation in this embodiment. Each operation (read, program, and erase) in this embodiment is performed by applying voltages as shown in Table 8. The major effects of this embodiment are the same as the effects of the first embodiment.

TABLE 8

| | | Selected block | |
| | | Unselected memory cell | Selected memory cell | Unselected block |
|---|---|---|---|---|
| Reverse | WL | Vcc | Vcc | 0 V |
| read | SL | 0 V | Vcc−Vsa | 0 V |
| | BL | 0 V | Vcc | 0 V |
| Pro- | WL | 5.5 V or 0 V | 5.5 V | 0 V |
| gram | SL | Vcc | 0 V | 0 V |
| | BL | 0 V or 5 V | 5 V | 0 V |
| Erase | WL | | −3 V | 0 V |
| | SL | | 0 V | 0 V |
| | BL | | 5 V | 0 V |

In this embodiment, the FN erase method may also be used. Table 9 shows the voltage application state during erasing (FN erase). A symbol Pwell indicates the substrate 414 and has the same meaning in all tables.

TABLE 9

| | | Selected block Selected memory cell | Unselected block |
|---|---|---|---|
| Erase | WL | −8 V | 0 V |
| | SL | 5 V | 0 V |
| | BL | 5 V | 0 V |
| | Pwell | 5 V | 0 V |

3. Third Embodiment

A third embodiment is described below with reference to the drawings.

Figure 14:
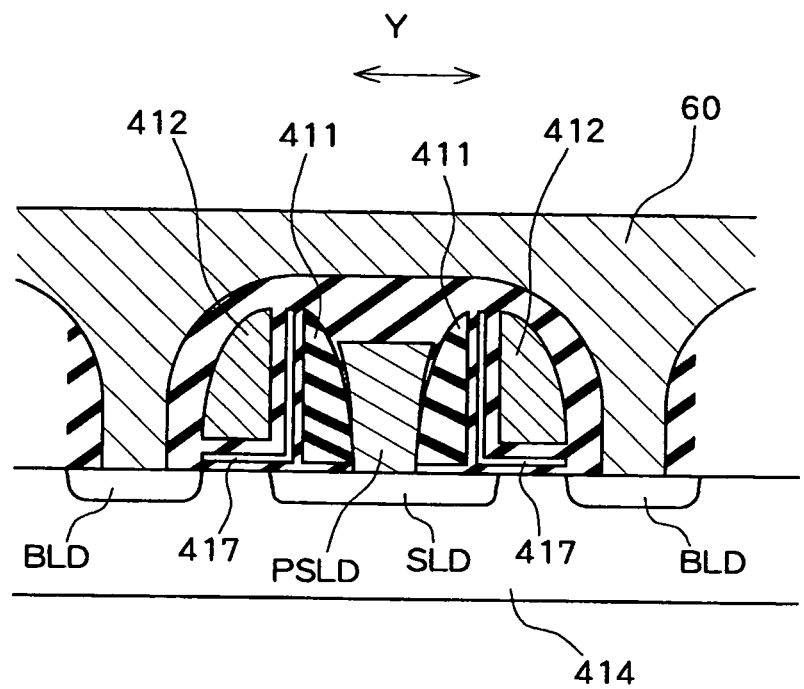
FIG. 14 is a cross-sectional view showing a memory block according to a third embodiment of the present invention.

FIG. 14 is a cross-sectional view showing a part of the memory block 400 in the third embodiment. The difference in structure between the third embodiment and the first embodiment is the position of the bitline diffusion layer BLD and the source line diffusion layer SLD. In the first embodiment, the bitline diffusion layer BLD is disposed below two adjacent word gate support sections 411, and the source line diffusion layer SLD is disposed between two word gates 412. In this embodiment, the positional relationship between the bitline diffusion layer BLD and the source line diffusion layer SLD is the reverse of that in the first embodiment. Specifically, as shown in FIG. 14, the source line diffusion layer SLD is disposed below two word gate support sections 411. The bitline diffusion layer BLD is disposed between two word gates 412 (only a part is shown in FIG. 14).

Figure 15:
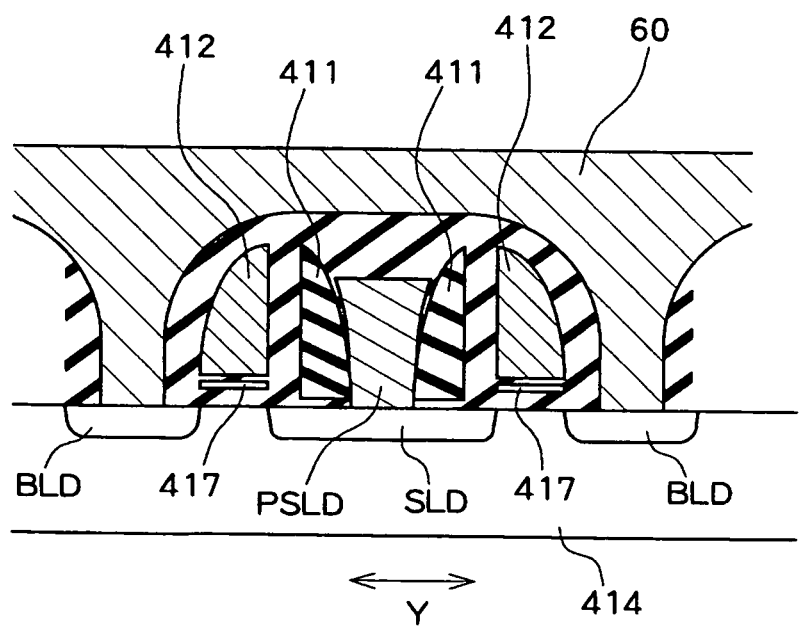
FIG. 15 is a cross-sectional view showing a memory block according to a modification of the third embodiment.

As a modification of this embodiment, the nitride film 417 may be formed between the word gate 412 and the substrate 414 without being formed to extend between the word gate support section 411 and the word gate 412, as shown in FIG. 15.

The voltage application state in each operation of this embodiment is the same as the voltage application state in the first embodiment. The effects of this embodiment are the same as the effects of the first embodiment.

4. Fourth Embodiment

A fourth embodiment is described below with reference to the drawings.

Figure 16:
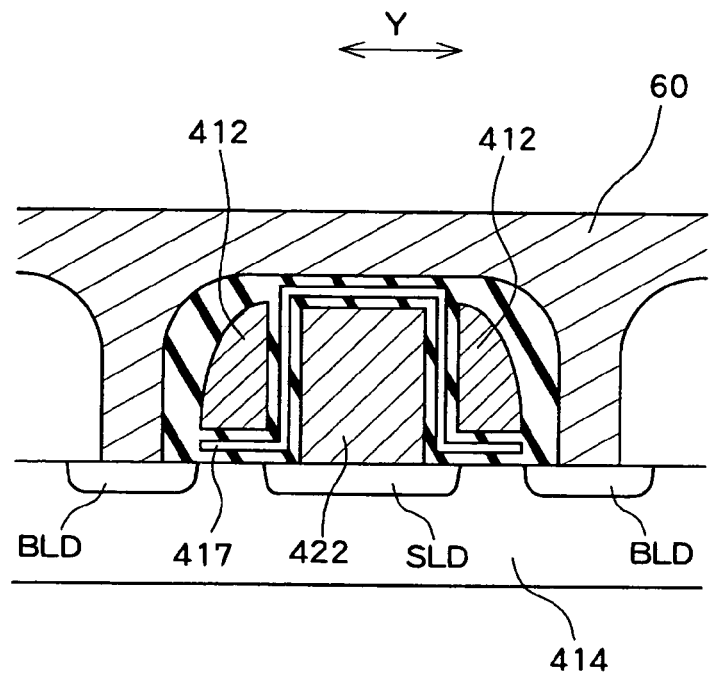
FIG. 16 is a cross-sectional view showing a memory block according to a fourth embodiment of the present invention.

FIG. 16 is a cross-sectional view showing a part of the memory block 400 in the fourth embodiment. In this embodiment, a source conductor 422 is formed on the source line diffusion layer SLD instead of the poly plug PSLD and two word gate support sections 411 formed on the source line diffusion layer SLD in the third embodiment. The rest of the details is the same as in the third embodiment.

Figure 17:
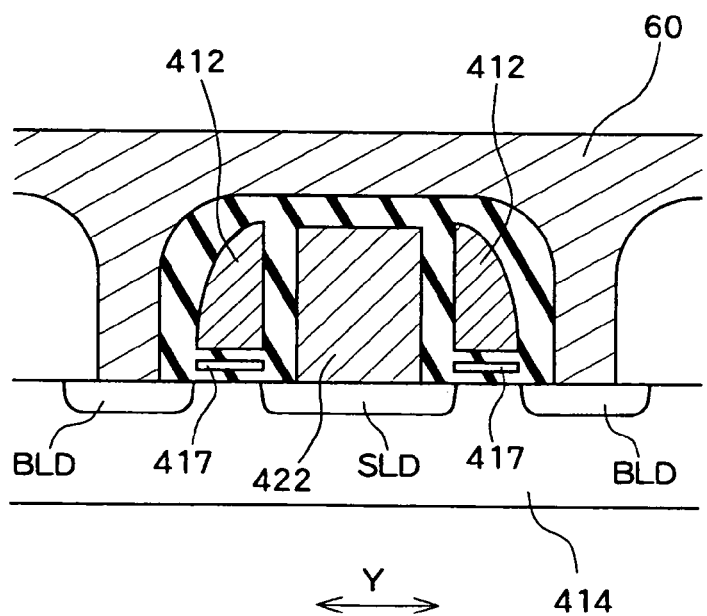
FIG. 17 is a cross-sectional view showing a memory block according to a modification of the fourth embodiment.

As shown in FIG. 17, the nitride film 417 may be formed between the word gate 412 and the substrate 414 without being formed to extend between the source conductor 422 and the word gate 412.

The voltage application state in each operation in this embodiment is the same as the voltage application state in the first embodiment. The effects of this embodiment are the same as the effects of the first embodiment.

5. Method of Manufacturing the Non-Volatile Semiconductor Memory Device of the First and Second Embodiments A method of manufacturing the non-volatile semiconductor memory device according to the first embodiment and the second embodiment is described below with reference to the drawings.

Figure 18:
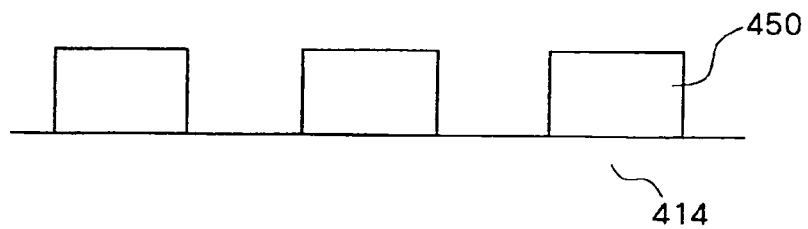
FIG. 18 is a cross-sectional view showing a step in the method of manufacturing a non-volatile semiconductor memory device according to the first and second embodiments of the present invention.
Figure 19:
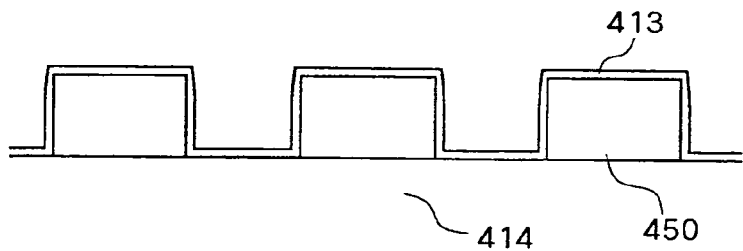
FIG. 19 is a cross-sectional view showing a step in the method of manufacturing a non-volatile semiconductor memory device according to the first and second embodiments of the present invention.
Figure 20:
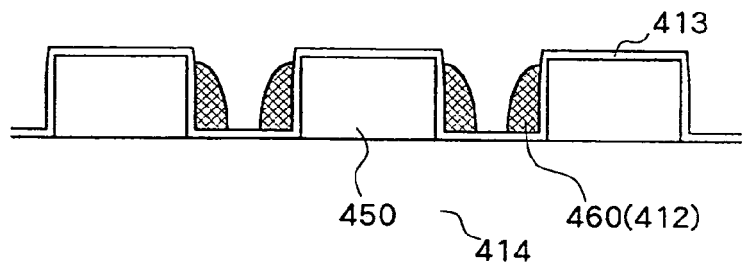
FIG. 20 is a cross-sectional view showing a step in the method of manufacturing a non-volatile semiconductor memory device according to the first and second embodiments of the present invention.

A first insulating layer 450 (silicon oxide layer, for example) which is a base material layer is formed on the substrate 414, and is patterned (see FIG. 18). The ONO film 413 is deposited over the entire surface (see FIG. 19). A first conductive layer 460 (polysilicon layer, for example) is deposited over the entire surface, and the first conductive layer 460 is etched (see FIG. 20). This allows the sidewall-shaped word gate 412 to be formed.

Figure 21:
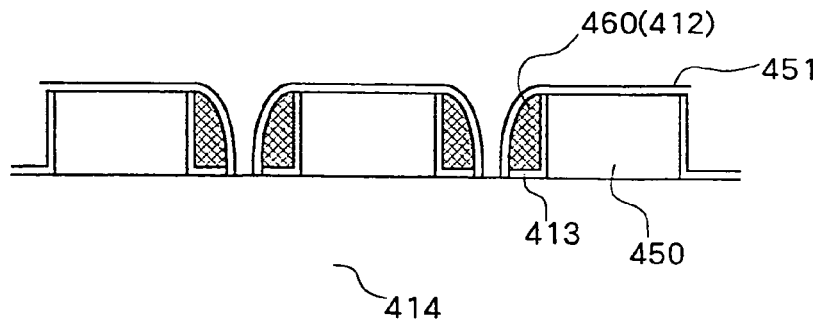
FIG. 21 is a cross-sectional view showing a step in the method of manufacturing a non-volatile semiconductor memory device according to the first and second embodiments of the present invention.

The ONO film 413 is etched by using the sidewall-shaped first conductive layer 460 as a mask. An insulator (silicon oxide, for example) is formed over the entire surface. A second insulating layer 451 is formed by etching the deposited insulator (see FIG. 21).

Figure 22:
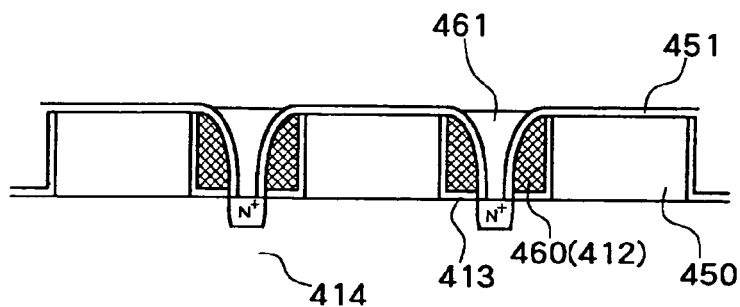
FIG. 22 is a cross-sectional view showing a step in the method of manufacturing a non-volatile semiconductor memory device according to the first and second embodiments of the present invention.

N-type impurities are injected (ion-implanted) into the surface of the substrate 414, whereby the source line diffusion layer SLD is formed in the substrate 414. A conductor (polysilicon, for example) is deposited over the entire surface. The conductor deposited on the surface of the first insulating layer 450 as the base material layer is etched, whereby a second conductive layer 461 (poly plug PSLD) is formed (see FIG. 22).

Figure 23:
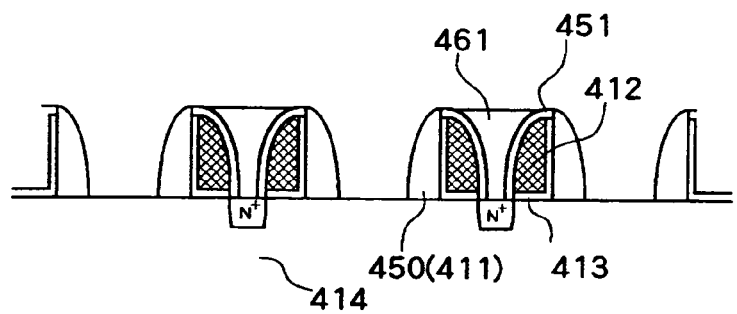
FIG. 23 is a cross-sectional view showing a step in the method of manufacturing a non-volatile semiconductor memory device according to the first and second embodiments of the present invention.

The first insulating layer 450 which is the base material layer is etched. This allows the sidewall-shaped first insulating layer 450 (word gate support section 411) to be formed (see FIG. 23).

Figure 24:
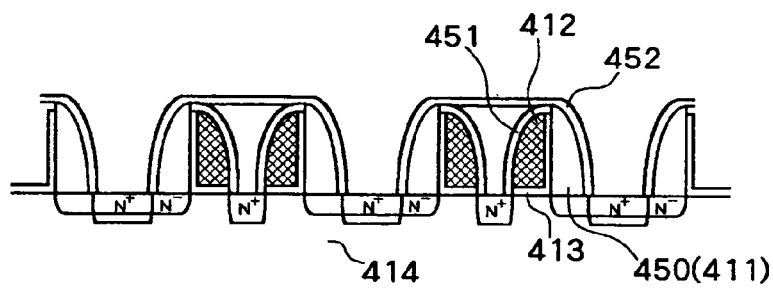
FIG. 24 is a cross-sectional view showing a step in the method of manufacturing a non-volatile semiconductor memory device according to the first and second embodiments of the present invention.

A high concentration of N-type impurities are injected (ion-implanted) into the surface of the substrate 414, and an insulator (silicon oxide, for example) is formed over the entire surface. The deposited insulator is etched. The surface of the substrate 414 into which a high concentration of N-type impurities are injected (ion-implanted) is subjected to a heat treatment, whereby an N-type impurity diffusion layer having a low impurity concentration is formed. This allows the bitline diffusion layer BLD to be formed in the substrate 414 (see FIG. 24).

Figure 25:
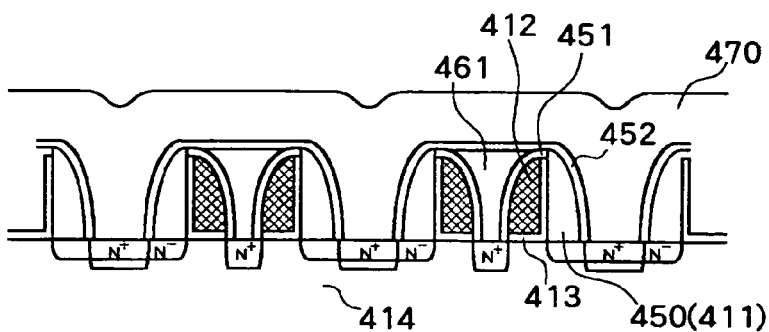
FIG. 25 is a cross-sectional view showing a step in the method of manufacturing a non-volatile semiconductor memory device according to the first and second embodiments of the present invention.

A metal interconnect layer 470 is deposited over the entire surface, and the deposited metal interconnect layer 470 is etched corresponding to the interconnect pattern. This allows the bitline 60 to be formed (see FIG. 25).

This is the method of manufacturing the non-volatile semiconductor memory device according to the first embodiment. This manufacturing method may become the method of manufacturing the non-volatile semiconductor memory device according to the second embodiment by changing the material used in the step of forming the first insulating layer 450, which is the base material layer, from an insulator (silicon oxide, for example) to a conductor (polysilicon, for example).

Figure 26:
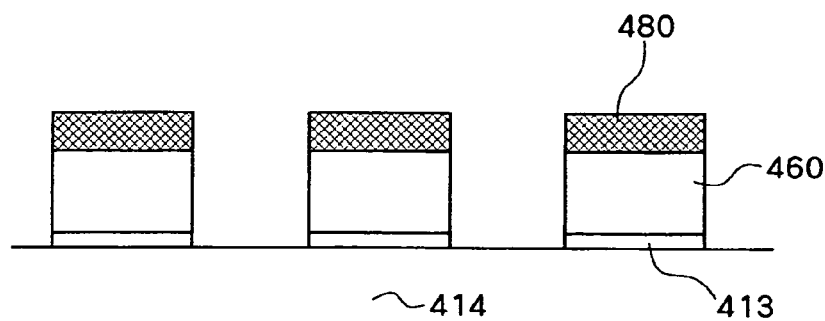
FIG. 26 is a cross-sectional view showing a step in the method of manufacturing a non-volatile semiconductor memory device according to the third embodiment of the present invention.

6. Method of Manufacturing the Non-Volatile Semiconductor Memory Device of the Third Embodiment The ONO film 413 is deposited on the substrate 414, and the first conductive layer 460 (polysilicon layer, for example) is deposited on the ONO film 413. The first conductive layer 460 (polysilicon layer, for example) is patterned by using a silicon nitride film 480. Specifically, the first conductive layer 460 is etched by using the silicon nitride film 480 as a mask. The ONO film 413 is etched by using the silicon nitride film 480 as a mask (see FIG. 26).

Figure 27:
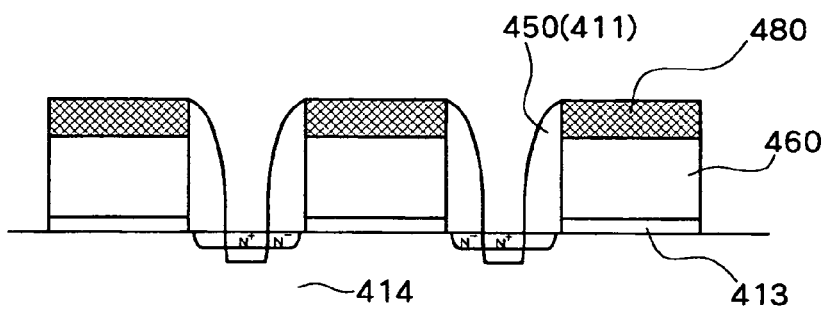
FIG. 27 is a cross-sectional view showing a step in the method of manufacturing a non-volatile semiconductor memory device according to the third embodiment of the present invention.

The first insulating layer 450 is deposited on the substrate 414. The first insulating layer 450 is etched, whereby the sidewall-shaped first insulating layer 450 (word gate support section 411) is formed. A high concentration of N-type impurities are injected (ion-implanted) into the surface of the substrate 414. The surface of the ion-implanted substrate 414 is subjected to a heat treatment, whereby an impurity diffusion layer having a low impurity concentration is formed in the substrate 414. This allows the source line diffusion layer SLD to be formed (see FIG. 27).

Figure 28:
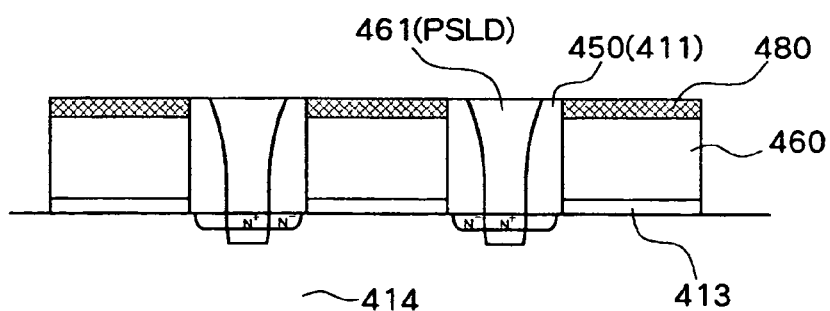
FIG. 28 is a cross-sectional view showing a step in the method of manufacturing a non-volatile semiconductor memory device according to the third embodiment of the present invention.

The second conductive layer 461 (polysilicon layer, for example) is deposited on the substrate 414. The uppermost surface of the substrate 414 on which each layer is stacked is polished and planarized by using a chemical mechanical polishing (CMP) method. This allows the poly plug PSLD to be formed on the source line diffusion layer SLD (see FIG. 28).

Figure 29:
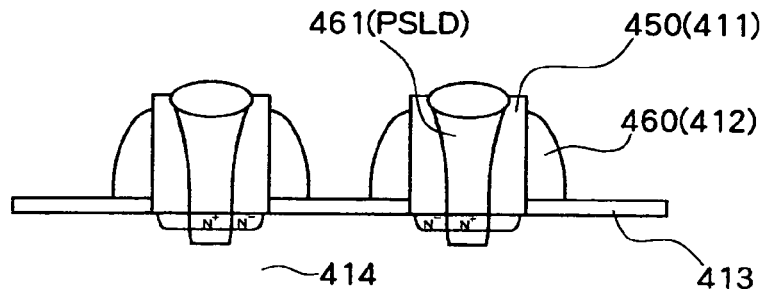
FIG. 29 is a cross-sectional view showing a step in the method of manufacturing a non-volatile semiconductor memory device according to the third embodiment of the present invention.

The surface of the poly plug PSLD is subjected to an oxidation treatment, whereby an insulator (silicon oxide) is formed on the surface of the poly plug PSLD. The silicon nitride film 480 is removed, and the first conductive layer 460 (polysilicon layer, for example) is etched. This allows the first conductive layer 460 (polysilicon layer, for example) to be formed in the shape of a sidewall (see FIG. 29).

Figure 30:
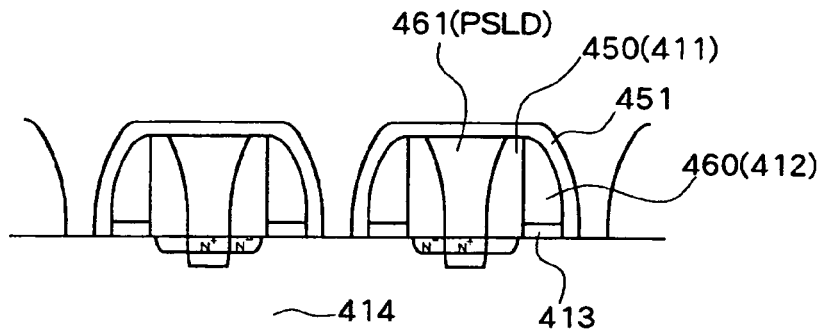
FIG. 30 is a cross-sectional view showing a step in the method of manufacturing a non-volatile semiconductor memory device according to the third embodiment of the present invention.

The ONO film 413 is etched. The second insulating layer 451 is then deposited and etched, whereby the second insulating layer 451 is formed as an insulating film (see FIG. 30).

Figure 31:
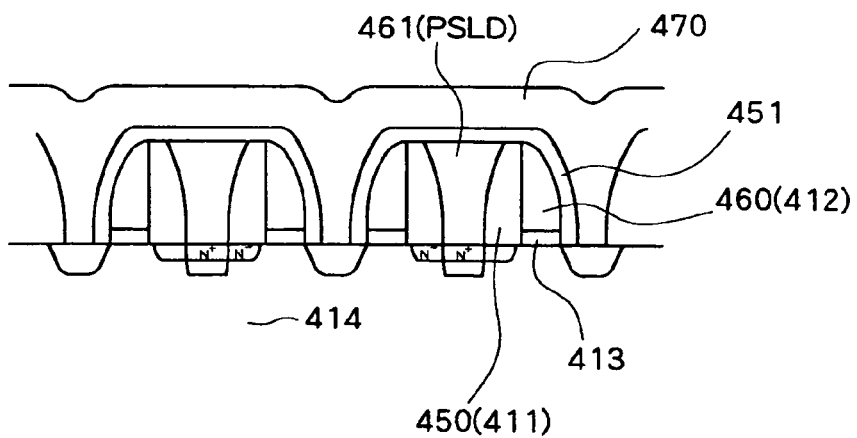
FIG. 31 is a cross-sectional view showing a step in the method of manufacturing a non-volatile semiconductor memory device according to the third embodiment of the present invention.

N-type impurities are injected (ion-implanted) into the surface of the substrate 414, whereby the bitline diffusion layer BLD is formed. The metal interconnect layer 470 is deposited over the entire surface, and the deposited metal interconnect layer 470 is etched corresponding to the interconnect pattern. This allows the bitline 60 to be formed (see FIG. 31).

This is the method of manufacturing the non-volatile semiconductor memory device according to the third embodiment.

Figure 32:
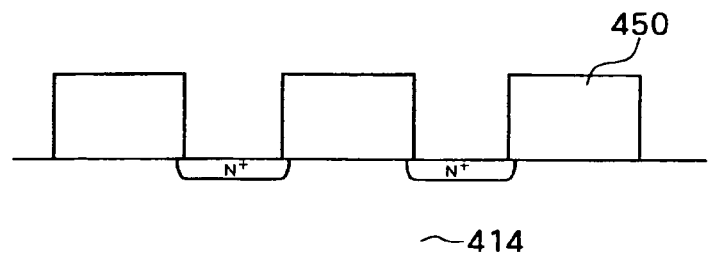
FIG. 32 is a cross-sectional view showing a step in the method of manufacturing a non-volatile semiconductor memory device according to the fourth embodiment of the present invention.

7. Method of Manufacturing the Non-Volatile Semiconductor Memory Device of the Fourth Embodiment The first insulating layer 450 (silicon oxide layer, for example) is deposited. The first insulating layer 450 (silicon oxide layer, for example) is patterned and then etched. N-type impurities are injected (ion-implanted) into the surface of the substrate 414, whereby the source line diffusion layer SLD is formed (see FIG. 32).

Figure 33:
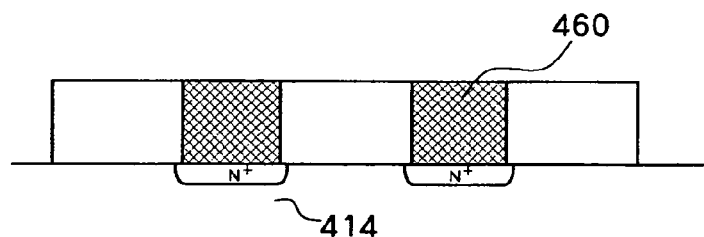
FIG. 33 is a cross-sectional view showing a step in the method of manufacturing a non-volatile semiconductor memory device according to the fourth embodiment of the present invention.

The first conductive layer 460 (polysilicon layer, for example) is deposited over the entire surface. The surface of the deposited first conductive layer 460 is etched, and polished and planarized by using a chemical mechanical polishing (CMP) method (see FIG. 33).

Figure 34:
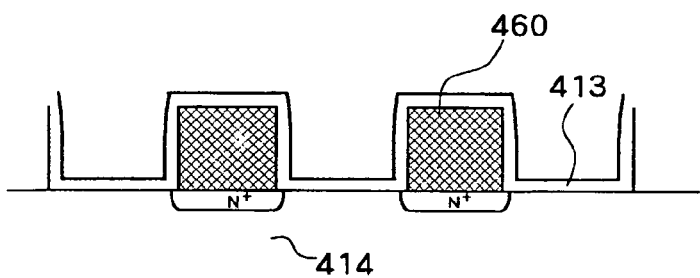
FIG. 34 is a cross-sectional view showing a step in the method of manufacturing a non-volatile semiconductor memory device according to the fourth embodiment of the present invention.
Figure 35:
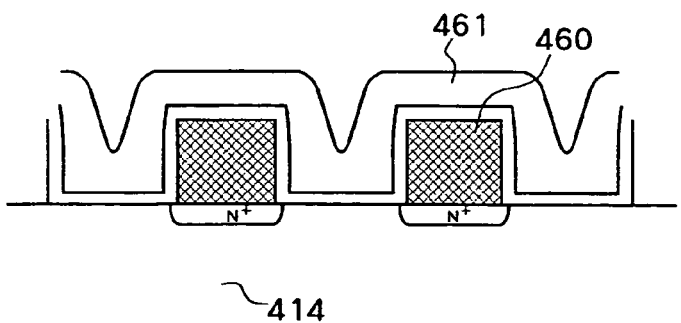
FIG. 35 is a cross-sectional view showing a step in the method of manufacturing a non-volatile semiconductor memory device according to the fourth embodiment of the present invention.

The first insulating layer 450 (silicon oxide layer, for example) is removed, and the ONO film 413 is deposited over the entire surface (see FIG. 34). The second conductive layer 461 is deposited over the entire surface (see FIG. 35).

Figure 36:
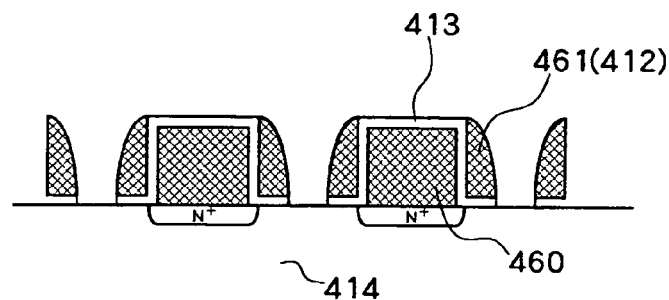
FIG. 36 is a cross-sectional view showing a step in the method of manufacturing a non-volatile semiconductor memory device according to the fourth embodiment of the present invention.
Figure 37:
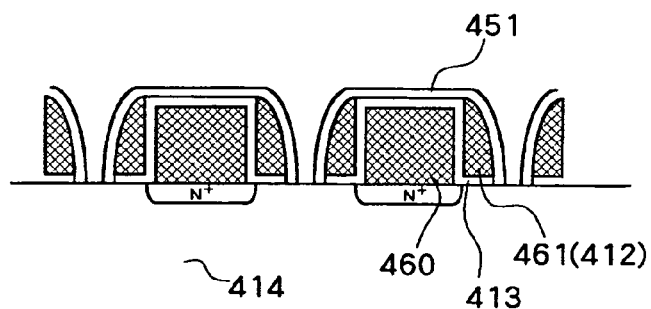
FIG. 37 is a cross-sectional view showing a step in the method of manufacturing a non-volatile semiconductor memory device according to the fourth embodiment of the present invention.

The second conductive layer 461 is etched. This allows the second conductive layer 461 to be formed as the sidewall-shaped word gate 412. The ONO film 413 is etched (see FIG. 36). The second insulating layer 451 is deposited and etched, whereby the second insulating layer 451 is formed as an insulating film (see FIG. 37).

Figure 38:
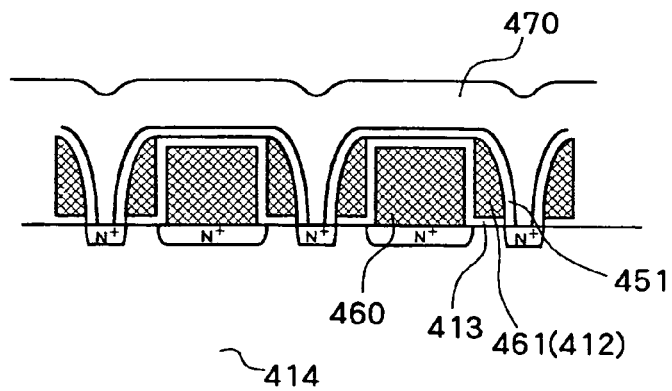
FIG. 38 is a cross-sectional view showing a step in the method of manufacturing a non-volatile semiconductor memory device according to the fourth embodiment of the present invention.

N-type impurities are injected (ion-implanted) into the surface of the substrate 414, whereby the bitline diffusion layer BLD is formed. The metal interconnect layer 470 is deposited over the entire surface, and the deposited metal interconnect layer 470 is etched corresponding to the interconnect pattern. This allows the bitline 60 to be formed (see FIG. 38).

This is the method of manufacturing the non-volatile semiconductor memory device according to the fourth embodiment.

In the method of manufacturing the non-volatile semiconductor memory device according to the fourth embodiment, the step of forming the sidewall-shaped elements (word gate support section 411 and word gate 412, for example) is performed once. Since the step of forming the sidewall-shaped elements takes time, this manufacturing method has the effect of simplifying the manufacturing steps.

The present invention can provide a non-volatile semiconductor memory device having a small layout area as described above.

The present invention is not limited to the above-described embodiments. Various modifications and variations are possible without departing from the spirit and scope of the present invention.

What is claimed is:

1. A non-volatile semiconductor memory device, comprising:
    a memory cell array including a plurality of bit lines and a plurality of memory cells arranged in a column direction and a row direction, wherein:
    each of the memory cells has a source region, a drain region, a channel region disposed between the source region and the drain region, a word gate disposed to face the channel region, and a non-volatile memory element provided between the word gate and the channel region;
    a voltage is respectively applied to the word gate, source region and drain region, when data is to be erased, read from or written to each of the plurality of memory cells;
    a longitudinal section of the word gate has a base, a side which is perpendicular to the base, and a curved side which connects the base to the sides;
    each of the plurality of memory cells has a word gate support section that is disposed on an upper layer of the drain region;
    a longitudinal section of the word gate support section has a base, a side that is perpendicular to the base, and a curved side that connects the base to the side;
    the side of the word gate support section faces the side of the word gate;
    the plurality of bit lines are respectively connected to the drain regions of the plurality of memory cells in each column that is arranged in the column direction; and
    the word gate support section is formed of an insulator.

2. The non-volatile semiconductor memory device as defined in
claim 1, the non-volatile memory element being formed to extend between the word gate and the word gate support section.

3. The non-volatile semiconductor memory device as defined in claim 1,
the non-volatile memory element being formed of an ONO film which includes two oxide films (O) and a nitride film (N) between the two oxide films (O).

4. A non-volatile semiconductor memory device, comprising:
a memory cell array including a plurality of bit lines and a plurality of memory cells arranged in a column direction and a row direction, wherein:
each of the memory cells has a source region, a drain region, a channel region disposed between the source region and the drain region, a word gate disposed to face the channel region, and a non-volatile memory element provided between the word gate and the channel region;
a voltage is respectively applied to the word gate, source region and drain region, when data is to be erased, read from or written to each of the plurality of memory cells;
a longitudinal section of the word gate has a base, a side that is perpendicular to the base, and a curved side that connects the base to the side;
each of the plurality of memory cells has a word gate support section that is disposed on an upper layer of the source region;
a longitudinal section of the word gate support section has a base, a side that is perpendicular to the base, and a curved side that connects the base to the side;
the side of the word gate support section faces the side of the word gate;
the plurality of bit lines are respectively connected to the source regions of the plurality of memory cells in each column that is arranged in the column direction; and
the word gate support section is formed of an insulator.

5. The non-volatile semiconductor memory device as defined in claim 4, the non-volatile memory element being formed to extend between the word gate and the word gate support section.

6. The non-volatile semiconductor memory device as defined in claim 4, the non-volatile memory element being formed of an ONO film that includes two oxide films (O) and a nitride film (N) between the two oxide films (O).

* * * * *